United States Patent [19]

Kleyer et al.

[11] Patent Number: 5,198,032

[45] Date of Patent: Mar. 30, 1993

[54] APPARATUS FOR VAPOR DEPOSITING ON TAPE HAVING GROOVED EVAPORATOR CELL

[75] Inventors: Siegfried Kleyer, Hainburg; Jochen Heinz, Leigestern, both of Fed. Rep. of Germany

[73] Assignee: Leybold Aktiengesellschaft, Hanau, Fed. Rep. of Germany

[21] Appl. No.: 770,854

[22] Filed: Oct. 3, 1991

[30] Foreign Application Priority Data

Aug. 27, 1991 [DE] Fed. Rep. of Germany ....... 4128382

[51] Int. Cl.[5] ............................................. C23C 14/00
[52] U.S. Cl. ................................... 118/718; 118/730; 118/726; 373/118; 392/388; 392/389
[58] Field of Search ............... 118/726, 718; 432/262; 373/112, 118; 392/388, 389

[56] References Cited

U.S. PATENT DOCUMENTS

| 2,962,538 | 11/1960 | Alexander . | |
| 3,117,887 | 1/1964 | Shepard et al. | 118/726 X |
| 5,076,203 | 12/1991 | Vaidya et al. | 118/726 X |

Primary Examiner—Brian E. Hearn
Assistant Examiner—Jonathan D. Baskin
Attorney, Agent, or Firm—Felfe & Lynch

[57] ABSTRACT

The invention relates to a tape vapor coating apparatus for the production of film webs 50 coated in a vacuum, with a coating chamber for the accommodation and advancement of a film web 50 as well as an evaporation source 19 provided in the housing and having at least one evaporating cell 21, at least one recess 15 being provided in the evaporating cell 21 to accommodate the substance that is to be evaporated. In the recess 15 of the evaporating cell 21 for the accommodation of the substance to be evaporated there is provided an additional, groove-like recess 14.

9 Claims, 1 Drawing Sheet

APPARATUS FOR VAPOR DEPOSITING ON TAPE HAVING GROOVED EVAPORATOR CELL

The invention relates to a tape vapor depositing apparatus for the production of vacuum-coated film webs, with a coating chamber to accommodate and advance a film web, as well as an evaporation source provided in the housing and having at least one evaporating cell, at least one cavity being provided in the evaporating cell to contain the substance to be evaporated.

It is already generally known in web coating apparatus for vapor depositing aluminum to use evaporating cells in whose cavities aluminum is vaporized, i.e., the aluminum which is melted therein is to be distributed uniformly in this cavity. There are a few problems: first the wire melts not directly on the surface but above the cavity, so that it begins to drip. As a result of the dripping the bath becomes very agitated and slight aluminum spatters form which fly against the film and damage it to some extent and sometimes burn through it. The result is the so-called "pinholes," i.e., perforations in the film which are harmful in the production of condensers, since they render the film unusable.

This arrangement has the disadvantage that on the standard evaporating cell the wire melts in the area where it enters and a kind of wedge-shaped puddle forms. This results in a different wetting of the cell and a differently evaporating surface, i.e., the rate of evaporation of the individual cells differs. This in turn produces a varying coating thickness on the film.

Accordingly, the invention consists in achieving a drip-free melting of the wire in the evaporation cell, so that no more spattering can occur.

The problem is solved according to the invention by the fact that at least one additional recess is provided in the recess in the evaporating cell to contain the substance being evaporated. In this simple manner pinholes, i.e., perforations, in the material to be coated are reduced or even eliminated, since now a uniform evaporation is possible.

A uniformly evaporating surface is also achieved by the fact that the additional recess is in the form of a groove running lengthwise of the evaporating cell. It is thereby advantageously brought about that the evaporating cell is completely wetted in its entire cavity. The danger of the formation of deposits such as dirt, oxide products and the like at the margins on account of cavities when, as formerly, the melt drips in at the margins, can be avoided by configuring the evaporation cell in accordance with the invention, so that no more spattering will occur in the area of the recess to damage the film.

It is advantageous, furthermore, that the additional groove runs approximately along the central axis of the recess.

In further development of the invention it is advantageous that the additional recess configured as a groove runs parallel to the longitudinal central axis of the first recess and has approximately the same depth as the first recess with respect to its top edge.

According to a preferred embodiment of the solution according to the invention it is lastly provided that the groove be approximately 1 to 1.5 mm wide.

It is of special importance to the present invention that the groove have a depth of about 0.5 to 1.0 mm from the upper edge of the first recess.

In connection with the arrangement of the recess it is advantageous for at least one additional groove to branch off from the groove and for the groove running lengthwise of the first recess to be joined by numerous grooves running V-wise.

It is furthermore advantageous for the groove running lengthwise of the first recess to be joined by numerous grooves running V-wise which have approximately the same depth as the grooves running lengthwise.

It is furthermore advantageous to provide a cooled mounting means, especially a U-shaped mounting means, at the rear end of the evaporating cell to prevent the aluminum from running out at the back end of the evaporating cell. The mounting means can also have different contacting shapes, especially at the end.

Additional details of the invention are described in the subordinate claims and description, and represented in the figures, and it is to be noted that all individual features and all combinations of individual features are important to the invention.

The invention is represented in the figures by an embodiment given by way of example, without being limited to this embodiment.

Figure 1:
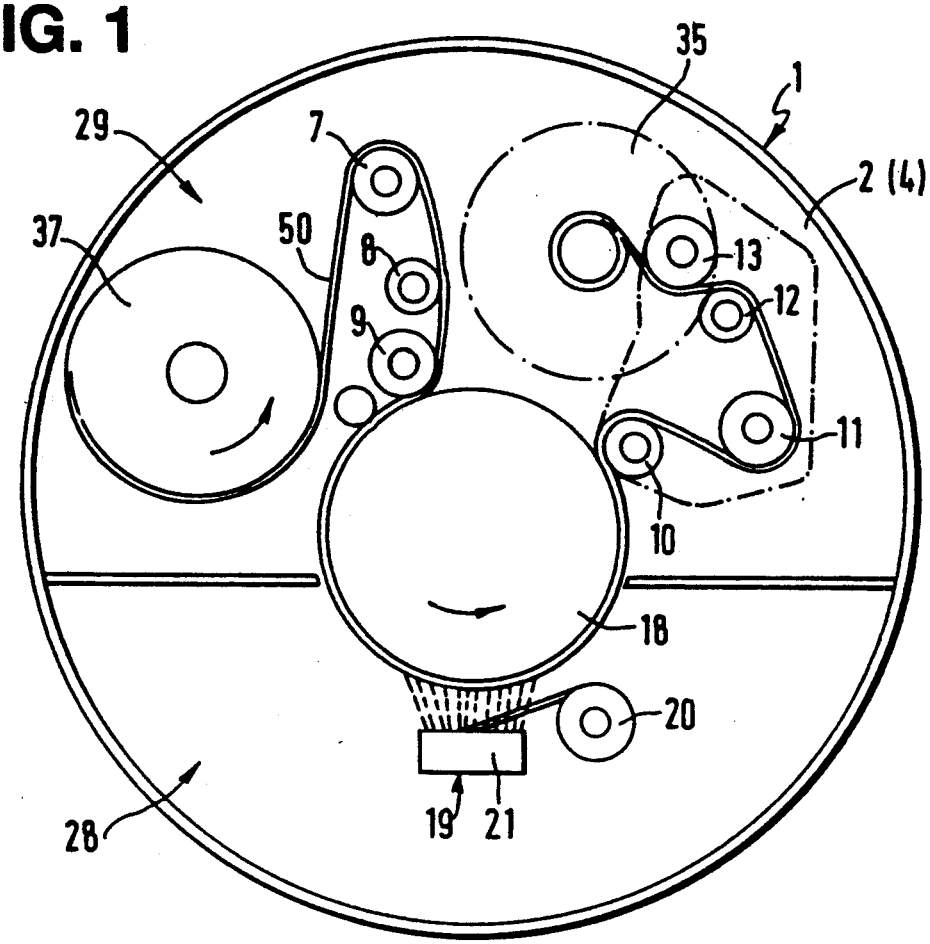
FIG. 1 shows a cross-sectional side view of an apparatus for the vapor depositing of tape, with a winder and numerous pulley rolls for the tape, FIG. 2 a top view of an evaporating cell, FIG. 3 a longitudinal section of the evaporating cell of FIG. 2.

In the drawing, 1 identifies a tape vapor coating apparatus which consists essentially of the pulley rolls, stretching rolls and tightening rolls 7 to 13 and the cooled coating roll 18. Furthermore, the tape vapor coating apparatus 1 has a supply roll 37, a take-up roll 35, a coating chamber 28, and an evaporation source 19 with an aluminum wire spool 20 and the evaporation cell 21 in accordance with the invention, which is shown in greater detail in FIGS. 2 and 3. A winding apparatus 29 is provided on the upper half of the chamber.

In the apparatus represented in FIG. 1, the pulley rolls 7 to 13 for the transport and guidance of the film web 50 are disposed such that the film web portion 50, which is directly in front of the coating roll 18, runs downward at an angle, i.e., virtually perpendicularly from the pulley roll 9. It is also possible for this portion of the film web 50 to be guided differently.

Figure 2:
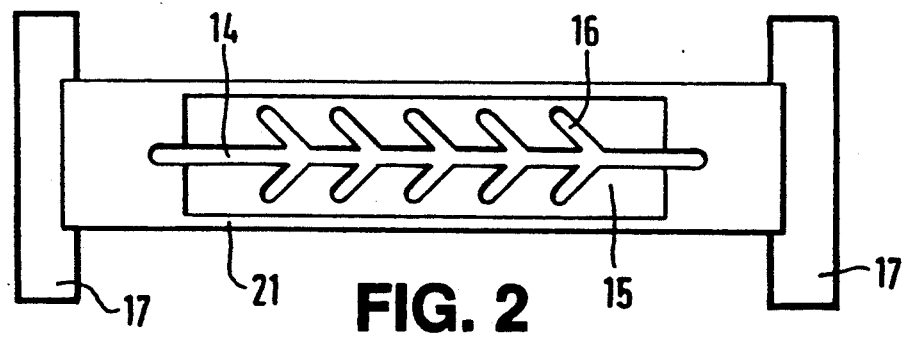
Figure 3:
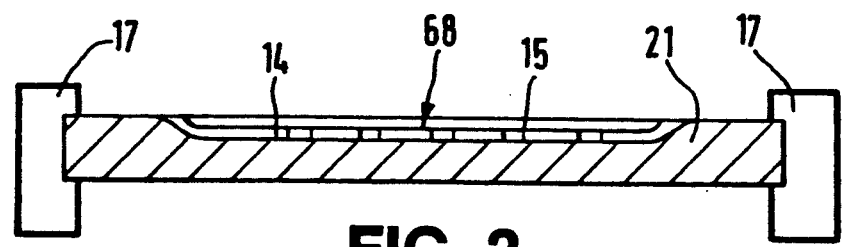

In FIG. 2 and 3 there is shown the evaporating cell 21 which is used especially for the vapor depositing of aluminum. It is, however, not impossible to use the evaporating cell 21 for vapor-depositing other materials.

The evaporating cells 21 are provided lengthwise with a recess 15 for holding aluminum, which can have a depth of about 0.5 mm. In the recess 15 there is additionally created a small groove 14 which runs along the long axis of the evaporating cell 21 and again has a recess of about 0.5 mm with respect to an upper edge 68 of the recess 15. The groove 14 can be about 1–1.5 mm wide and 0.5–1.0 mm deep.

The recess is created by milling it into the evaporating cell 21 made of ceramic. By the advantageous milling of the recess 15 it is brought about in a simple manner that a uniform wetting of the product to be deposited is achieved from the outset. It has been found that the deeper this pit is the easier it is to start the evaporating cell 21 anew. The evaporating cell 21 withstands cycles of several hours, which can be repeated about 50 times. After that the evaporating cell 21 is replaced.

To prevent the aluminum from running out, a cooled mounting means 17 is provided at the back end of the evaporating cell 21; it can be U-shaped or otherwise configured.

As it appears from FIG. 2, a plurality of grooves 16 running V-wise can join the longitudinally running groove 14, and they also serve to receive the aluminum and have the same depth as groove 14.

It is furthermore possible to mill a plurality of longitudinal grooves in the evaporating cell 21 made from ceramic.

Due to the milling of the groove 14 or grooves 16, the molten aluminum runs better into the evaporator, so that less spatter is caused, which leads to pinholes in the film and thus renders it unusable. By the use of the grooves 14, 16, milled in the evaporating cell 21 a substantial reduction of the said pinholes is achieved overall.

We claim:

1. Tape vapor coating apparatus for the production of film webs coated in a vacuum, comprising: a coating chamber for the accommodation and advancing of a film web, an evaporation source in the chamber and having at least one evaporating cell, at least one recess being in the evaporating cell to accommodate the substance to be evaporated, at least one additional recess leading into the recess of the evaporating cell for the accommodation of the substance to be evaporated, the additional recess being configured as a first groove which runs lengthwise of the evaporating cell, at least one additional groove branching off from the first groove.

2. Tape vapor coating apparatus according to claim 1, in which the additional recess is configured as a groove and runs approximately on the central axis of the recess.

3. Tape vapor coating apparatus according to claim 1, in which the additional recess configured as a groove runs parallel to the longitudinal axis of the first recess.

4. Tape vapor coating apparatus according to claim 3, in which the additional recess configured as a groove has approximately the same depth as the first recess with respect to an upper edge thereof.

5. Tape vapor coating apparatus according to claim 1 in which the first groove is approximately 1.0 to 1.5 mm wide.

6. Tape vapor coating apparatus according to claim 1 in which the groove from the top edge of the first recess is approximately 0.5 to 1.0 mm deep.

7. Tape vapor coating apparatus according to claim 1, in which numerous grooves running V-wise join the groove running lengthwise of the first recess.

8. Tape vapor coating apparatus according to claim 1, which includes numerous grooves running V-wise and joining the groove running lengthwise of the first recess and having approximately the same depth as the groove running lengthwise.

9. Tape vapor coating apparatus according to claim 1, which includes, to prevent the running out of Al at the rear end of the evaporating cell, a cooled mounting means.

* * * * *